United States Patent [19]
Itoh

[11] Patent Number: 5,903,025
[45] Date of Patent: May 11, 1999

[54] SEMICONDUCTOR MEMORY DEVICE AND METHOD FOR MANUFACTURING THE SAME

[75] Inventor: Yoshio Itoh, Tokyo, Japan

[73] Assignee: Oki Electric Industry Co., Ltd., Tokyo, Japan

[21] Appl. No.: 08/277,527

[22] Filed: Jul. 19, 1994

[30] Foreign Application Priority Data

Jul. 29, 1993 [JP] Japan .................................... 5-188508

[51] Int. Cl.$^6$ .......................... H01L 27/02; H01L 23/48; H01L 29/40
[52] U.S. Cl. .......................... 257/308; 257/311; 257/401
[58] Field of Search ................................... 257/301, 303, 257/296, 306, 311, 307, 308, 309, 310, 390, 401

[56] References Cited

U.S. PATENT DOCUMENTS

| | | | |
|---|---|---|---|
| 4,392,150 | 7/1983 | Courreges | 257/383 |
| 4,460,911 | 7/1984 | Salters | 257/306 |
| 5,177,575 | 1/1993 | Ikeda | 257/296 |
| 5,245,205 | 9/1993 | Higasitani et al. | 257/296 |
| 5,449,934 | 9/1995 | Shono et al. | 257/295 |

Primary Examiner—Donald L. Monin, Jr.
Attorney, Agent, or Firm—Rabin, Champagne & Lynt

[57] ABSTRACT

In an element region, in which a memory cell is constituted, on a silicon substrate, a gate electrode with which each of a plurality of the memory cells is individually constituted is individually disposed for each memory cell. A first and a second inter-layer insulating films are formed right upon the gate electrode. A jumping wiring is disposed on the insulating films. The jumping wiring is directly and electrically connected, within the memory pattern region in which the memory cell is formed, with each individual gate electrodes through the jumping contact.

26 Claims, 7 Drawing Sheets

SEMICONDUCTOR MEMORY DEVICE AND METHOD FOR MANUFACTURING THE SAME

Reference to Related Application

This application claims the priority right under 35 U.S.C. 119, of Japanese Patent Application No. Hei 05-188508 filed on Jul. 29, 1993, the entire disclosure of which is incorporated herein by reference.

BACKGROUND OF THE INVENTION

1. Field of the Invention

The present invention relates to a semiconductor memory device and, more particularly, to an improved semiconductor memory device and a method for manufacturing the same which incorporates therein wirings for voltage supply such as a jumping wiring.

2. Description of Related Arts

A lot of demands, high density integration, multifunction, low power consumption or the like, has been made to a large scale integration (LSI) device.

To realize the demands, it has been required to form a more precise and finer circuit pattern. Not only to comply with the above demands but also to realize a high speed operation is a very important factor to a semiconductor memory device among LSIs such as a dynamic random access memory (DRAM). Accordingly, product developing activities accompanying a variety of improvements have been made to the semiconductor memory device with reference to designing for a circuit pattern or choosing material for wiring to satisfy those demands.

It is well known that a memory cell of DRAM is, for example, constituted of a transistor and a capacitor. Contents stored in the memory cell are read out by applying a voltage to a gate electrode wiring to vary a voltage of a gate electrode, which causes to drive the transistor. Informations designated as "1" or "0" are read out by transferring charges stored in the capacitor, which is connected with the transistor, to a bit line.

As described above, DRAM is controlled in such a manner that the voltage of the gate electrode arrives at the supply voltage by supplying a voltage to the gate electrode wiring. However, with accompanied by the high density integration and the large scale capacity, there arises a problem that a voltage which is supplied to the gate electrode wiring may take long time to come to the supplied level of voltage in each of the gate electrodes, which causes short of an operational speed. To avoid the problem, there has been utilized a jumping wiring, a low resistivity wiring for applying a voltage to the gate electrode wiring, which is electrically connected with the gate electrode wiring through a contact pattern located outside of a memory cell pattern region in which the memory cell is formed, whereby the time required for settling voltages at each gate electrodes to the applied voltage can be shorten.

In a conventional semiconductor memory device which employs the jumping wiring, there exist resistance on the gate electrode wiring and parasitic capacitance on the gate electrode in an element region of the gate electrode wiring so that a time (hereinafter called as a rising time for a gate electrode) is required from when a voltage is applied to the gate electrode wiring until when the voltage of the gate electrode arrives at the voltage applied.

Further, in such a semiconductor memory device, a gate electrode itself of one memory cell among gate electrode wirings serves concurrently as a wiring for applying a voltage to a gate electrode of the adjacent memory cell. Therefore, if each of the gate electrodes respectively requires its rising time, it may take time from when one gate electrode rises until when an adjacent gate electrode rises, which is called as a delay of the rising time between gate electrodes. As a result of the accumulated delays, a large amount of delay may be generated from when a voltage is applied to one gate electrode wiring until when gate electrodes of the entire memory cells which jointly own the gate electrode wiring rise. This delay is a big problem to be solved without fail in such a semiconductor memory device.

As described above, the conventional semiconductor memory device, even though it incorporates a jumping wiring therein, has not achieved a high operational speed sufficintly enough as compared to, for example, a logic LSI. Accordingly, it has been highly requested to accelerate further the operational speed of the semiconductor memory device by shortening the rising time of the gate electrode and reducing the delay of the rising times between each gate electrodes.

SUMMARY OF THE INVENTION

It is an object of the present invention to provide a semiconductor memory device and a method for manufacturing the same with which a high operational speed can be realized.

To accomplish the object, there is provided a semiconductor memory device comprising:

(a) a memory cell in which a gate electrode is formed;

(b) a voltage supply wiring for applying a voltage to the gate electrode; and (c) connection means for electrically connecting the voltage supply wiring with the gate electrode within a memory cell pattern region where the memory cell is formed.

According to the another aspect of the present invention, there is provided a method for manufacturing a semiconductor memory device, comprising steps of:

(a) forming on a substrate in which an element isolation region is formed a gate electrode;

(b) forming on the gate electrode an inter-layer insulating film;

(c) forming right upon the gate electrode within a memory cell pattern region in which the memory cell constituting the semiconductor memory device is constituted a jumping contact hole which penetrates through the inter-layer insulating film;

(d) forming on the inter-layer insulating film and the gate electrode exposed within the jumping contact hole a jumping wiring; and (e) forming a memory capacitor which constitutes each memory cell after the jumping wiring is formed.

According to the semiconductor memory device and a manufacturing method thereof, a gate electrode is connected with a voltage supply wiring, for example, a jumping wiring through a jumping contact hole within a memory pattern region in which a memory cell is formed.

Therefore, a resistance of the gate electrode can be reduced in comparison with the case in which the gate electrode is connected with the voltage supply wiring such as the jumping wiring only outside of the memory cell pattern. As a result, the rising time of the gate electrode can be shortened.

Further, since a number of the gate electrodes to which a voltage is applied through the adjacent gate electrode is reduced, the delay of the rising time between each gate electrodes can be relatively reduced than that of the conventional one, which contributes to realization of high operational speed as compared to that of the conventional device.

Direct voltage application to the gate electrodes for each memory cell can be achieved by, for example, electrically connecting each gate electrode constituting each memory cell with the voltage supply wiring. Accordingly, a voltage can be applied directly from the voltage supply wiring to each gate electrode of each memory cell without through the other gate electrodes. This may reduce the resistance of the gate electrode as compared to the conventional gate electrode wiring. As a result, the rising time of the gate electrode can not only be shortened but also the delay of the rising time between the gate electrodes can be reduced, which may contribute to realize a high operational speed of the semiconductor memory device.

Further, the parasitic capacitance of the gate electrode can be reduced than that of the conventional gate electrode wiring by employing a structure in which each gate electrode of the adjacent memory cells is, for example, disposed with space with each other, which may also contribute to realize a high operational speed of the semiconductor memory device.

Also according to the method for manufacturing the semiconductor memory device in accordance with the present invention, a semiconductor memory device can be easily realized which reveals an identical equivalent circuit as that of the conventional semiconductor memory device incorporating therein a jumping wiring as a voltage supply wiring and performs high speed operation.

If the memory cell is, for example, constituted of DRAM, a semiconductor memory device can be realized without impairing its integration density.

BRIEF DESCRIPTION OF DRAWINGS

By way of example and to make the description more clear, reference is made to the accompanying drawings in which.

DETAILED DESCRIPTION OF THE PREFERRED EMBODIMENTS

Detailed description will be made in reference to the attached drawings as to a semiconductor memory device and a method for manufacturing the same. It should be noted that the following accompanied drawings merely show dimensions, sizes and arrangements of each constructional components of the device according to the present invention in a schematic way only enough to understand the invention. Accordingly, it is apparent that the present invention should not be restricted to the examples illustrated in the drawings.

Figure 1:
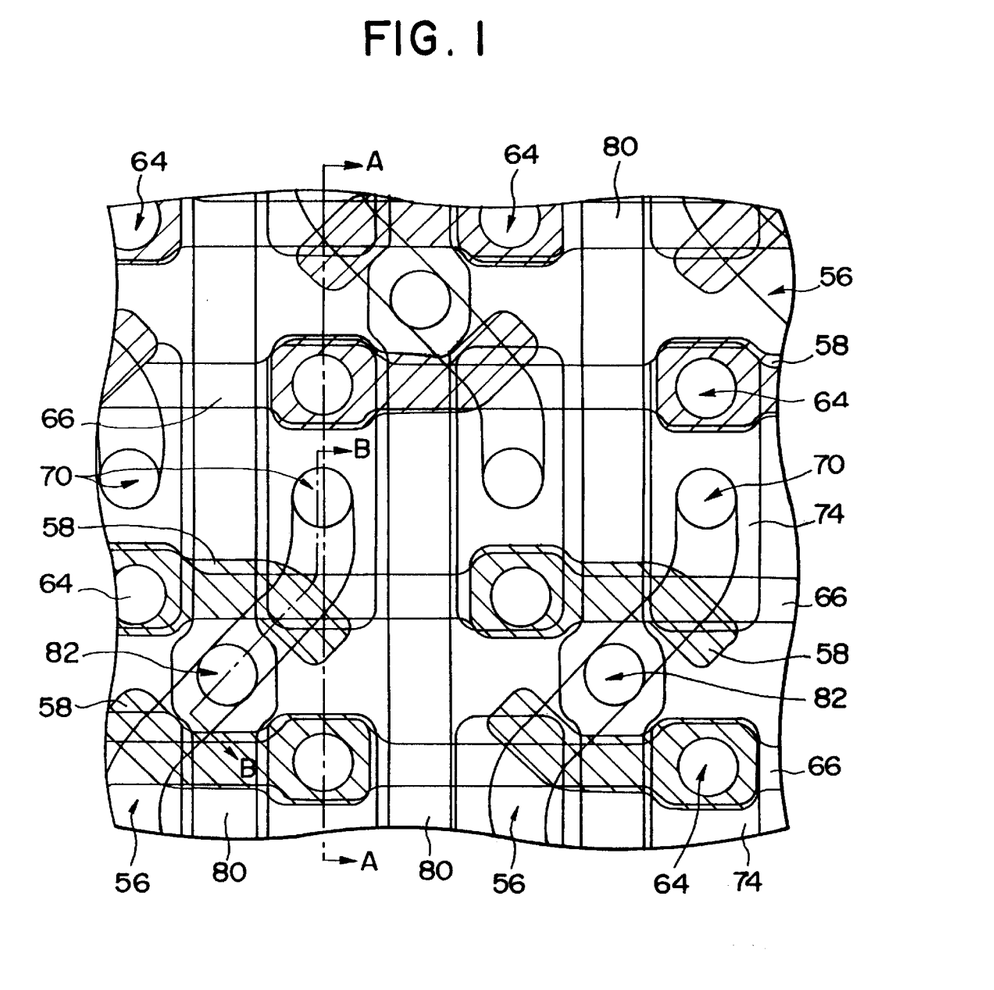
FIG. 1 is a plan view illustrating one embodiment of a semiconductor memory device according to the present invention.
Figure 2:
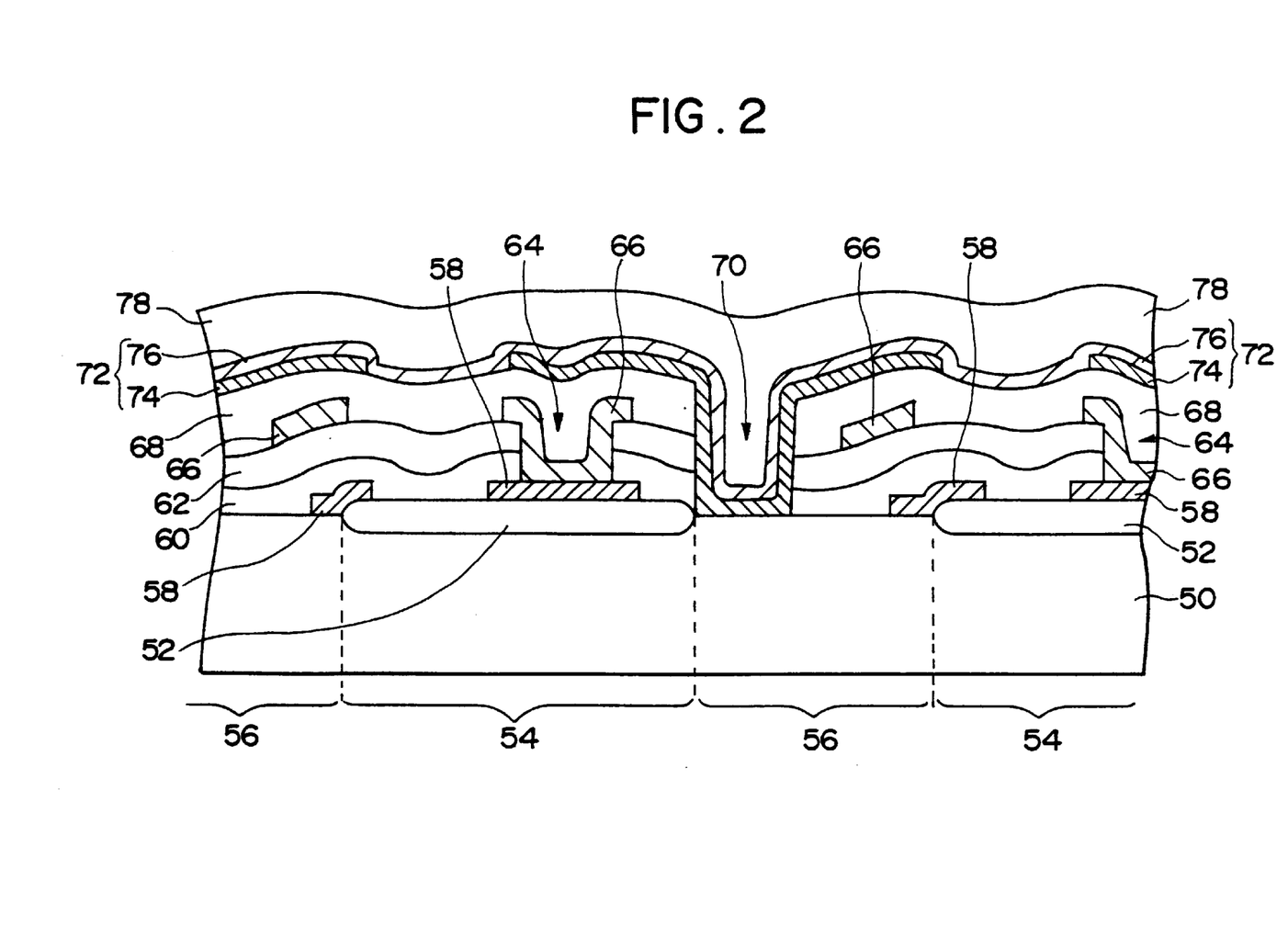
FIG. 2 is a cross sectional view taken substantially on one dotted chain lines A—A shown in FIG. 1.

FIG. 1 is a partial plan view illustrating a structure of a semiconductor memory device according to the present invention, and FIG. 2 is a cross sectional view taken substantially on lines A—A in FIG. 1. FIG. 1 is so illustrated that each inter-layer insulating films and a plate electrode are omitted. FIG. 1 is also illustrated in a manner that oblique lines are drawn at a gate electrode region to emphasize the gate electrode, though it is not a cross section to which oblique lines are usually drawn.

Figure 6:
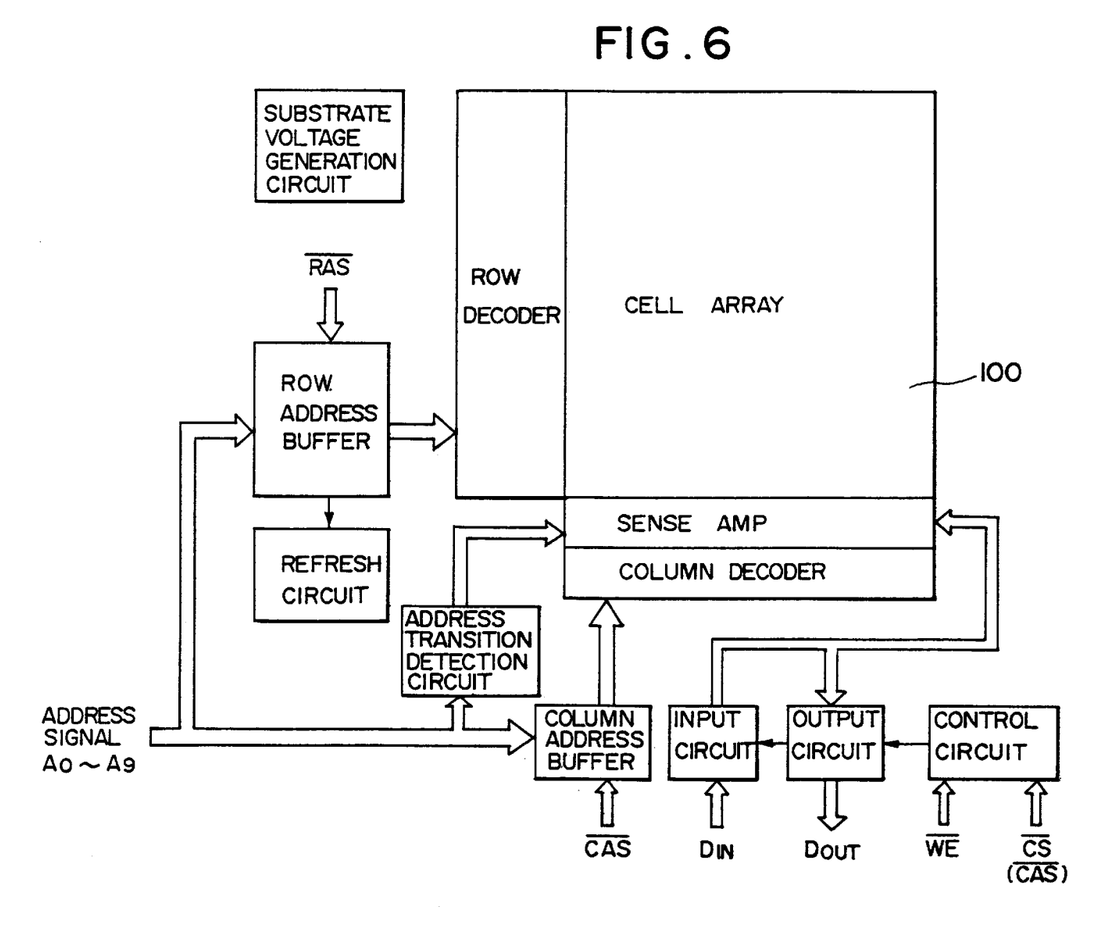
FIG. 6 is a block diagram illustrating a DRAM structure to which the semiconductor memory device according to the present invention is applied.

The semiconductor memory device according to this embodiment is constituted as a DRAM having a memory cell array 100 therein shown in FIG. 6. In the semiconductor memory device according to this embodiment, each of the gate electrodes is individually employed for each of a plurality of memory cells. A jumping wiring, which serves as a voltage supply wiring, and the gate electrode of the memory cell are, as described later in details, mutually and electrically connected through a jumping contact in a memory cell pattern region. This embodiment also employs a stacked capacitor as a capacitor which constitutes a memory cell.

As shown in FIG. 2, the semiconductor memory device according to this embodiment disposes a field oxide film 52 on the partial surface of a silicon substrate 50. As known well, the region on which the field oxide film 52 is disposed is called as an element isolation region 54 and the region on which the field oxide film 52 is not disposed is called as an element region 56. Though not illustrated in FIG. 2, an impurity diffusion layer (a channel stopper) can be implemented beneath the field oxide film 52.

A gate electrode 58, which works as a control electrode for controlling a switching element (a MOSFET in this embodiment) constituting a memory cell, is disposed on the silicon substrate 50. The gate electrode 58 reveals 1,500 to 4,000 Å (Å: Angstrom) in thickness and is constituted of a polysilicon film or a refractory metal film such as tungsten (w), molybdenum (Mo), titanium (Ti) or the like, or a eutectic of those refractory metals with silicon (Si). Though also not illustrated, a gate insulating film having 100 to 300 Å in thickness exists in the element region 56 between the silicon substrate 50 and the gate electrode 58.

This embodiment provides a plurality of the gate electrodes 58 individually for each of a plurality of the memory cells.

A first inter-layer insulating film 60 and a second inter-layer insulating film 62 are successively formed as an inter-layer insulating film on the gate electrode 58. The first inter-layer insulating film 60 is constituted of an oxide film having 1,500 to 6,000 Å in thickness, whereas the second inter-layer insulating film 62 is constituted of an oxide having 2,000 to 8,000 Å in thickness. Though not illustrated in FIG. 2, a bit line 80 is disposed on the first inter-layer insulating film 60 and contacted with the element region 56 in the silicon substrate 50 at a bit line contact 82.

The semiconductor memory device according to the present invention disposes a jumping contact 64 penetrating through the inter-layer insulating film, for example, the first and second inter-layer insulating films 60 and 62 which exists right upon the gate electrode 58 in the element isolation region 54. In this embodiment, the jumping contact 64 is disposed on the gate electrode 58 which is extended beneath a memory capacitor (described later) of the adjacent memory cell.

A jumping wiring 66 is disposed both on the second inter-layer insulating film 62 and on the gate electrode 58 exposed in the jumping contact 64.

This jumping wiring 66 reveals 2,000 to 8,000 Å in thickness and is constituted of a metal film consisting of aluminum or refractory metal as a principal component thereof. The jumping wiring 66 is electrically connected in the memory cell pattern region directly with each of the gate electrodes 58 which constitutes the respective memory cells.

There is provided a third oxide film 68 on the jumping wiring 66 having 4,000 to 10,000 Å in thickness.

A cell contact 70 penetrating through the first, second and third inter-layer insulating films 60, 62 and 68 is formed on the element region 56 but not on the gate electrode 58.

On the cell contact 70 and on the third inter-layer insulating film 68 surrounding the cell contact 70, there is formed a stacked capacitor 72 as a memory capacitor to constitute a memory cell. The stacked capacitor 72 is formed to be stacked with a storage electrode 74 and a plate electrode 76, each having 500 to 4,000 Å, respectively, in thickness. The storage electrode 74 is electrically connected with the silicon substrate 50 which is exposed in the cell contact 70. An extremely thin oxide film or an insulating film (not shown) constituted of an oxide film and nitride film ($Si_3N_4$ film) in combination which has approximately 50 to 300 Å in thickness has been formed between the storage electrode 74 and the plate electrode 76.

There is also provided a fourth inter-layer insulating film 78 having approximately 5,000 to 15,000 Å in thickness on the stacked capacitor 72.

Figure 4A:
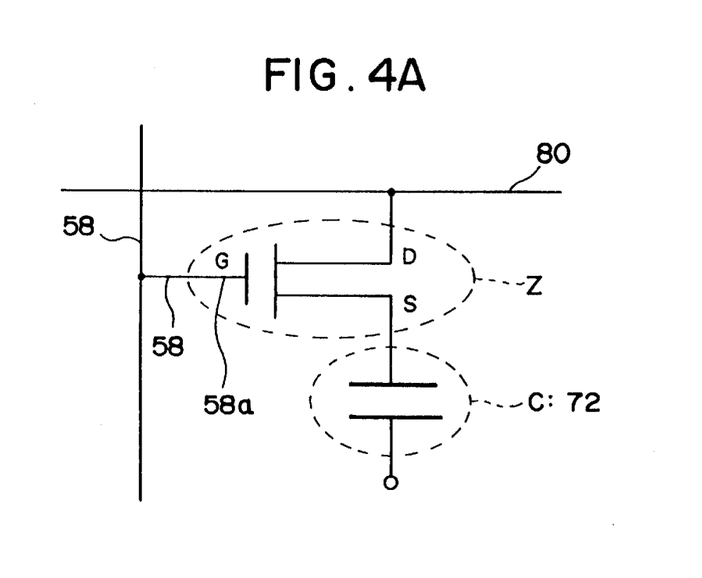
FIG. 4A shows an equivalent circuit diagram.
Figure 4B:
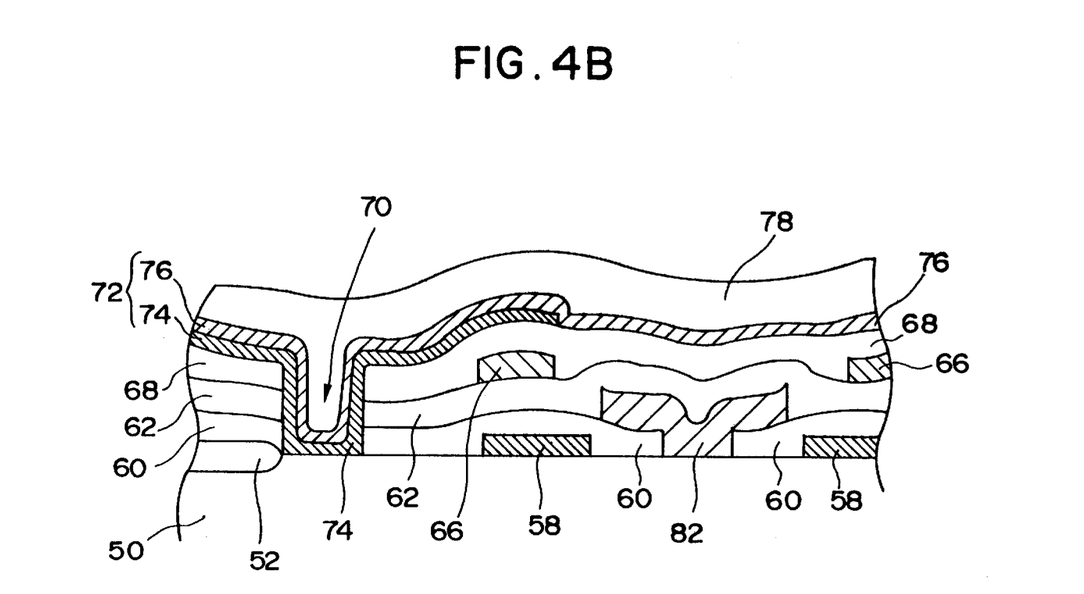
FIG. 4B shows a cross sectional view of the memory cell shown in FIG. 1 taken substantially on two dotted chain lines B—B.

To facilitate the understanding of the memory cell constituting the semiconductor memory device and its switching function, description will be made with reference to FIG. 4 by paying attention to one of the memory cells. FIG. 4A shows an equivalent circuit diagram of the memory cell; and FIG. 4B shows a cross sectional view taken substantially on lines B—B in the element region illustrated in FIG. 1.

A memory cell is, in general, constituted of a memory capacitor C and a switching element z respectively shown in FIG. 4A. In this memory cell, the stacked capacitor 72 as shown in FIG. 4B serves as the memory capacitor and charges stored in the storage electrode 74 constitute data. The switching element Z is constituted of a MOSFET. A control electrode (G), a first main electrode (S) and a second main electrode (D) of the MOSFET correspond to the gate electrode 58a, the storage electrode 74 of the stacked capacitor 26, and the bit line 80 of the bit contact 82, respectively. Data stored in the memory cell is read out by applying a voltage to the gate electrode wiring. Then, an inversion layer is generated on the surface of the silicon substrate 50 just beneath the gate electrode 58a. The charge stored in the stacked capacitor 72 can be transferred through the inversion layer and the bit contact 82 to the bit line 80.

Now, description will be made with reference to FIGS. 3A–3E as to a method for manufacturing the semiconductor memory device according to the embodiment shown in FIGS. 1 and 2. FIGS. 3A–3E are cross sectional views illustrating each manufacturing steps of the embodiment of the semiconductor memory device according to the present invention, in which hatching lines, which is usually utilized to show a cross section, are partially omitted.

Since the thickness and the quality of the material of each part which constitutes the semiconductor memory device are identical to those of the above described embodiment, description will be omitted hereinbelow.

Figure 3A:
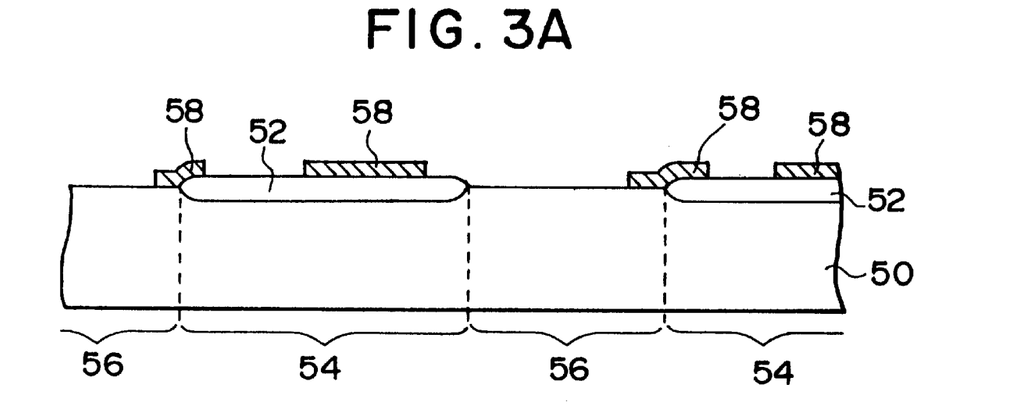
FIGS. 3A–3E are cross sectional views illustrating each manufacturing steps of the embodiment of the semiconductor memory device according to the present invention.

First, the gate electrode 58 is formed on the silicon substrate 50 in which the element isolation region 54 was formed (see FIG. 3A).

Figure 3B:
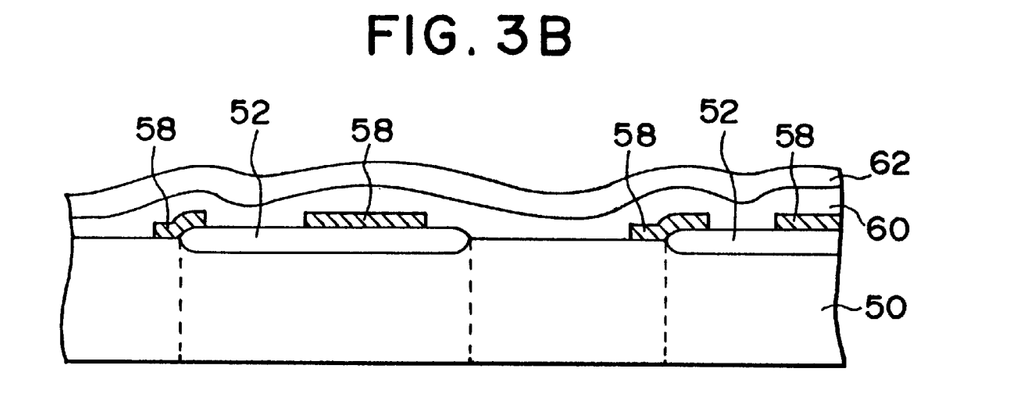

Then, the first and second inter-layer insulating films 60 and 62 are successively formed on the gate electrode 58 (see FIG. 3B). Though not shown in FIGS. 3A and 3B, a bit line contact is formed at the portion of the first inter-layer insulating film 60 on the element region 56, and a bit line is formed at the portion of the bit line contact and the first inter-layer insulating film 60.

Figure 3C:
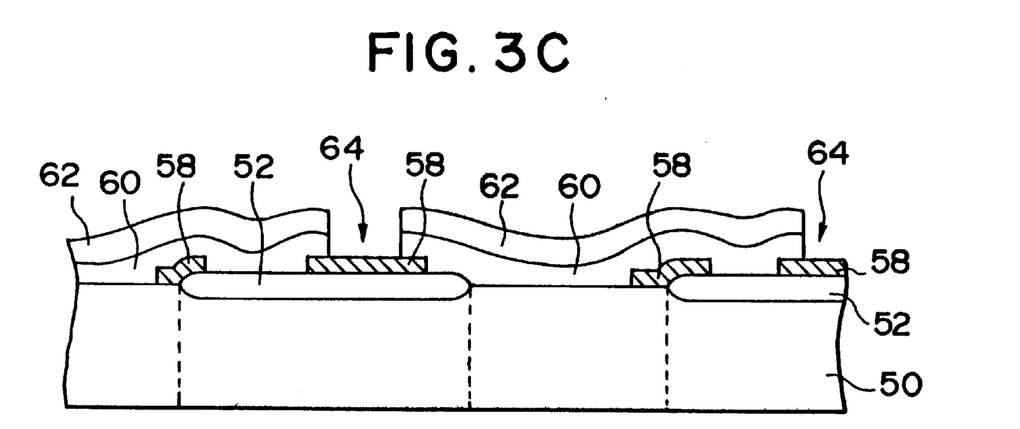

Then, the jumping contact 64 is formed as seen in FIG. 3C penetrating through the first and second inter-layer insulating films 60 and 62 right on the gate electrode 58 in the memory cell pattern region where the memory cell constituting the semiconductor memory device is located.

Figure 3D:
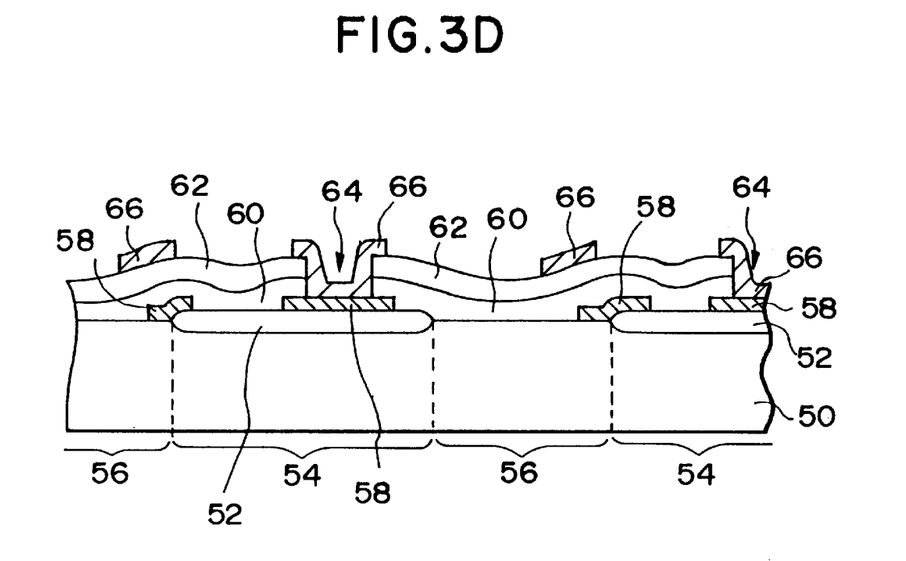
Figure 3E:
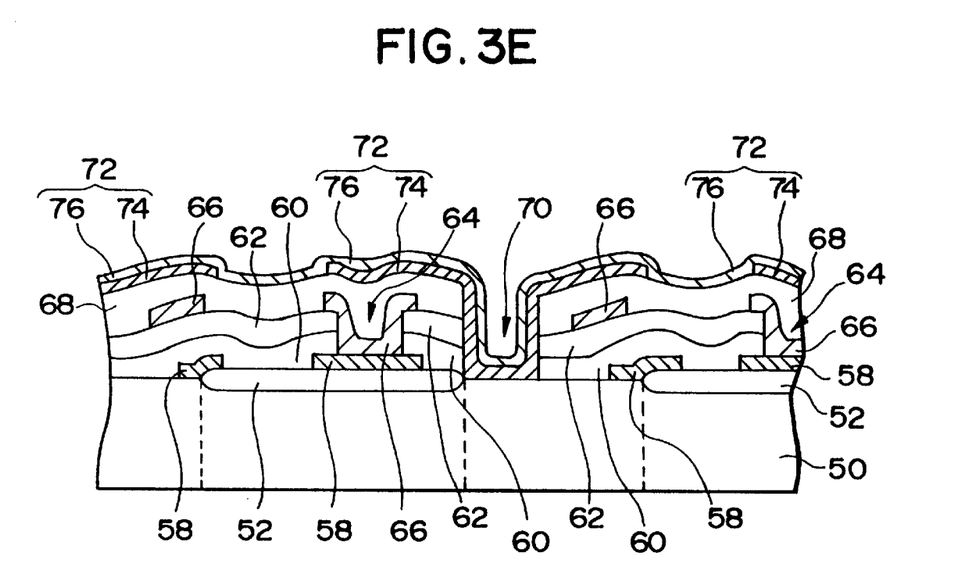

Then, the jumping wiring 66 is formed on the second inter-layer insulating film 62 and on the gate electrode exposed in the jumping contact 64. As a result, the jumping wiring 66 is directly and electrically connected as shown in FIG. 3D with each of the gate electrodes 58 which constitutes the respective memory cell within the memory cell pattern.

After forming the jumping wiring 66, a memory capacitor which constitutes each of the memory cells is formed. In this embodiment, the third inter-layer insulating film 68 is formed on the jumping wiring 66. Then, the cell contact 70 is formed on the element region 56 but not on the gate electrode 58, which penetrates through the first, second and third inter-layer insulating films 60, 62 and 68. Then, the stacked capacitor 72 is formed as the memory capacitor on the cell contact 70 and the third inter-layer insulating film 68 which surrounds the cell contact 70. The stacked capacitor 72 is formed by successively stacking the storage electrode 74, an extremely thin insulating film (not shown) and the plate electrode 76 in this order (see FIG. 3E). The structure obtained by forming the memory capacitor after the step with which the gate electrode is formed is usually called as a shielded type and suitable for improvement of integration density of the semiconductor memory device. Finally, the fourth inter-layer insulating film 78 is formed on the stacked capacitor 72 to obtain the structure of the semiconductor memory capacitor shown in FIG. 2.

Although description is made as to the embodiment in which specific materials are utilized and specific conditions are applied to construct the structure, the present invention can be changed or modified without departing from the spirit and scope thereof. For example, although the above described embodiment employs the DRAM as the semiconductor memory device, the present invention can also be constituted of a static random access memory (SRAM). Further, although the gate electrode is individually formed for each of the individual memory cells in the above embodiment, the present invention allows that the adjacent gate electrodes which co-own the jumping wire are formed to be connected with each other. Also, although the gate electrode and the jumping wiring are mutually connected in each memory cell under the present invention, one common electrode can be used as the gate electrode for a plurality of memory cells.

Figure 5:
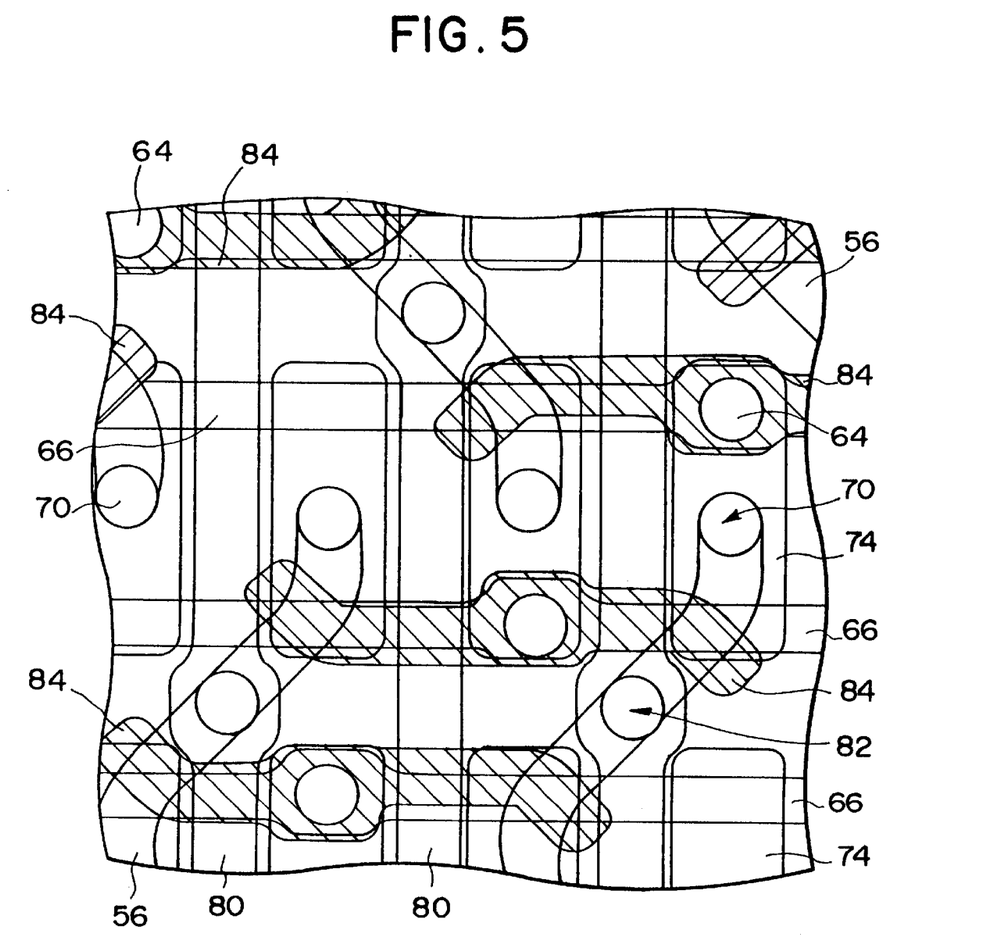
FIG. 5 is a plan view illustrating another embodiment of the semiconductor memory device according to the present invention.

FIG. 5 is a partial plan view illustrating a modified embodiment according to the present invention, in which is shown the semiconductor memory device, the gate electrode and the jumping wiring of which are connected with each other in each two memory cells. The semiconductor memory device according to the modified embodiment provides the gate electrode 84 commonly connected with the adjacent memory cell for each two memory cells. The jumping contact 64 is formed in each gate electrode 84 which is commonly used for each two memory cells. The modified embodiment has the same structure as that of the first embodiment except for the structure of the gate electrode 84 and the location of the jumping contact 64. Further, although the jumping wiring has been described by way of example for the voltage supply wiring, the voltage supply wiring is not necessarily restricted to be the jumping wiring.

In the above described embodiments, the connection between the voltage supply wiring and the gate electrode can be disposed at any region within the memory cell pattern region except for the cell contact region. Also, although description has been made as to the connection which is made through the jumping contact, the connection can be made in some cases without the jumping contact.

The semiconductor memory device and the method for manufacturing the same according to the present invention can electrically connect the gate electrode with the voltage supply wiring, for example, the jumping wiring within the memory cell pattern region in which the memory cell is formed. This can reduce the resistance of the gate electrode as compared to the case where the connection between the gate electrode and the voltage supply wiring is made only outside of the memory cell pattern region. As a result, the rising time for the gate electrode can be shortened and the delay of the respective rising times for the plural gate electrodes can be also reduced. Accordingly, high operational speed can be realized.

Further, direct voltage application to the gate electrode of each memory cell can be accomplished by, for example, electrically connecting the voltage supply wiring with each individual gate electrode in each memory cell so that direct voltage application from the jumping wiring to the gate electrode of each memory cell can be achieved without through the other gate electrode. This can reduce the resistance of the gate electrode as compared to the conventional one. As a result, the rising time for the gate electrode can be shortened and further the delay of the respective rising time for the plural gate electrodes can be also reduced, which results in realization of higher operational speed of the semiconductor memory device.

If, for example, each gate electrode of the adjacent memory cells are disposed with space with each other, the parasitic capacitance of the gate electrode can be reduced as compared to that of the conventional gate electrode wiring, which also results in realization of higher operational speed of the semiconductor memory device.

Further, by way of the method for manufacturing the semiconductor memory device, the semiconductor memory device can be readily realized which incorporates therein the jumping wiring as the voltage supply wiring, has the identical equivalent circuit to that of the conventional semiconductor memory device, and realizes higher operational speed.

Also, if the memory cell is constituted of DRAM, the semiconductor memory device can be achieved without impairing integration density.

What is claimed is:

1. A semiconductor memory device, comprising:
   a semiconductor substrate having a memory cell pattern region in which a plurality of memory cells are formed;
   a first insulating layer formed on the semiconductor substrate;
   a plurality of gate electrodes formed on the first insulating layer and in the memory cell pattern region, each gate electrode being provided for at least one and no more than two adjacent ones of the memory cells;
   a second insulating layer formed over the semiconductor substrate and each gate electrode, the second insulating layer having first contact holes therethrough to expose the gate electrodes;
   a plurality of voltage supply wirings, each voltage supply wiring being formed both on some of the gate electrodes through some of the first contact holes and on the second insulating layer, the voltage supply wirings supplying a voltage to the gate electrodes, each voltage supply wiring and the gate electrodes on which the voltage supply wiring is formed being connected to each other in the memory cell pattern region;
   a third insulating layer formed on the voltage supply wirings and the second insulating layer, the second and third insulating layers having therethrough second contact holes, the second contact holes exposing the semiconductor substrate; and
   a plurality of capacitors formed in the respective second contact holes and on the third insulating layer, each capacitor being formed in the memory cell pattern region and above the respective voltage supply wirings.

2. A semiconductor memory device as set forth in claim 1, wherein the first insulating layer is a gate insulating film.

3. A semiconductor memory device as set forth in claim 1, wherein the first insulating layer is a field oxide film.

4. A semiconductor memory device as set forth in claim 3, wherein each gate electrode and the voltage supply wiring formed thereon are connected over the field oxide film.

5. A semiconductor memory device as set forth in claim 1, wherein the second insulating layer is a composite layer having a fourth insulating layer and a fifth insulating layer.

6. A semiconductor memory device as set forth in claim 5, further comprising a bit line formed between the fourth insulating layer and the fifth insulating layer.

7. A semiconductor memory device, comprising:
   a semiconductor substrate having a memory cell pattern region in which a plurality of memory cells are formed;
   a plurality of gate electrodes formed over the semiconductor substrate and in the memory cell pattern region, each gate electrode being provided for at least one and no more than two adjacent ones of the memory cells;
   a plurality of voltage supply wirings, each voltage supply wiring being formed on some of the gate electrodes, each voltage supply wirings supplying a voltage to the gate electrodes, each voltage supply wiring and the gate electrodes on which the voltage supply wiring is formed being connected to each other in the memory cell pattern region; and
   a plurality of capacitors, each capacitor being formed in the memory cell pattern region and above the voltage supply wirings.

8. A semiconductor memory device as set forth in the claim 7, wherein the semiconductor memory device has a field oxide film on the semiconductor substrate.

9. A semiconductor memory device as set forth in claim 8, wherein each gate electrode is formed on the field oxide film.

10. A semiconductor device as set forth in claim 9, wherein each gate electrode and the voltage supply wiring formed thereon are connected over the field oxide film.

11. A semiconductor memory device comprising:
    a semiconductor substrate having a memory cell pattern region in which a plurality of memory cells are formed;
    a first insulating layer formed on the semiconductor substrate;
    a plurality of gate electrodes formed on the first insulating layer and in the memory cell pattern region, each gate electrode being provided for at least one and no more than two adjacent ones of the memory cells;

a second insulating layer formed on the gate electrodes and over the semiconductor substrate, the second insulating layer having first contact holes therethrough to expose the gate electrodes;

a plurality of voltage supply wirings, each voltage supply wiring being formed both on some of the gate electrodes through some of the first contact holes and on the second insulating layer, the voltage supply wirings supplying a voltage to the gate electrodes, each voltage supply wiring and the gate electrode on which the voltage supply wiring is formed being connected to each other in the memory cell pattern region;

a third insulating layer formed on the voltage supply wirings and the second insulating layer, the second and third insulating layers having therethrough second contact holes, the second contact holes exposing the semiconductor substrate; and a plurality of capacitors formed on the third insulating layer, the capacitors electrically connected to the semiconductor substrate in the respective second contact hole, each capacitor being formed in the memory cell pattern region and above the voltage supply wirings.

12. A semiconductor memory device as set forth in claim 11, wherein the first insulating layer is a gate insulating film.

13. A semiconductor memory device as set forth in claim 11, wherein the first insulating layer is a field oxide film.

14. A semiconductor memory device as set forth in claim 13, wherein each gate electrode and the voltage supply wiring formed thereon are connected over the field oxide film.

15. A semiconductor memory device, comprising:

a semiconductor substrate having a memory cell pattern region in which a plurality of memory cells are formed;

a plurality of gate electrodes formed over the semiconductor substrate and in the memory cell pattern region, each gate electrode being provided for at least one and no more than two adjacent ones of the memory cells;

a plurality of voltage supply wirings, each voltage supply wiring being formed on the gate electrodes, the voltage supply wirings supplying a voltage to the gate electrodes, each voltage supply wiring and the gate electrode on which the voltage supply wiring is formed being connected to each other in the memory cell pattern region; and a plurality of capacitors formed in the memory cell pattern region and above the voltage supply wirings.

16. A semiconductor memory device as set forth in claim 15, wherein the semiconductor memory device has a field oxide film on the semiconductor substrate.

17. A semiconductor memory device as set forth in claim 15, wherein each gate electrode is formed on the field oxide film.

18. A semiconductor memory device as set forth in claim 17, wherein each gate electrode and the voltage supply wiring formed thereon are connected over the field oxide film.

19. A semiconductor memory device as set forth in claim 15, wherein the capacitor of each memory cell is electrically connected to the semiconductor substrate.

20. A semiconductor memory device as set forth in claim 15, wherein the semiconductor memory device has bit lines, wherein the bit lines are formed above the gate electrodes, and wherein the capacitor of the memory cells are formed over the bit lines and the voltage supply wirings.

21. A semiconductor memory device as set forth in claim 20, wherein each gate electrode is made of a refractory metal selected from the group consisting of tungsten, molybdenum and titanium.

22. A semiconductor memory device as set forth in claim 20, wherein each gate electrode is made of a refractory metal selected from the group consisting of tungsten with silicide, molybdenum with silicide and titanium with silicide.

23. A semiconductor memory device as set forth in claim 20, wherein each voltage supply wiring is made of a refractory metal selected from the group consisting of tungsten, molybdenum and titanium.

24. A semiconductor memory device as set forth in claim 15, wherein each gate electrode is made of a refractory metal selected from the group consisting of tungsten, molybdenum and titanium.

25. A semiconductor memory device as set forth in claim 15, wherein each gate electrode is made of a refractory metal selected from the group consisting of tungsten with silicide, molybdenum with silicide and titanium with silicide.

26. A semiconductor memory device as set forth in claim 15, wherein each voltage supply wiring is made of a refractory metal selected from the group consisting of tungsten, molybdenum and titanium.

* * * * *